(12) United States Patent
Ribeiro et al.

(10) Patent No.: US 9,040,948 B2
(45) Date of Patent: May 26, 2015

(54) NANOSCALE SWITCHING DEVICE

(75) Inventors: Gilberto Ribeiro, Menlo Park, CA (US);
Janice H Nickel, Sunnyvale, CA (US);
Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/821,173

(22) PCT Filed: Sep. 16, 2010

(86) PCT No.: PCT/US2010/049091
§ 371 (c)(1),
(2), (4) Date: Mar. 6, 2013

(87) PCT Pub. No.: WO2012/036685
PCT Pub. Date: Mar. 22, 2012

(65) Prior Publication Data
US 2013/0168629 A1     Jul. 4, 2013

(51) Int. Cl.
*H01L 45/00*     (2006.01)
*H01L 27/24*     (2006.01)

(52) U.S. Cl.
CPC ............ *H01L 45/1233* (2013.01); *H01L 45/08* (2013.01); *H01L 45/1246* (2013.01); *H01L 45/146* (2013.01); *H01L 45/148* (2013.01); *H01L 45/1641* (2013.01); *H01L 27/2463* (2013.01)

(58) Field of Classification Search
CPC .. H04L 45/08; H04L 45/1246; H04L 27/2463
USPC .......................................................... 257/3
See application file for complete search history.

(56) References Cited

U.S. PATENT DOCUMENTS

| | | | |
|---|---|---|---|
| 7,615,770 B2 * | 11/2009 | Philipp et al. ..................... 257/2 |
| 7,763,880 B2 | 7/2010 | Williams | |
| 2007/0096248 A1 * | 5/2007 | Philipp et al. ................. 257/528 |
| 2008/0007995 A1 * | 1/2008 | Schwerin ...................... 365/163 |
| 2008/0011996 A1 | 1/2008 | Bednorz et al. | |

(Continued)

FOREIGN PATENT DOCUMENTS

| | | |
|---|---|---|
| EP | 1780814 | 5/2007 |
| JP | 2010-067942 A | 3/2010 |

(Continued)

OTHER PUBLICATIONS

Search Report, Jun. 17, 2013. European Patent Office, Much. Patent Application No. EP 10857383.3.

(Continued)

*Primary Examiner* — William F Kraig
*Assistant Examiner* — Pavel Ivanov
(74) *Attorney, Agent, or Firm* — Hewlett-Packard Patent Department

(57) ABSTRACT

A nanoscale switching device comprises a first electrode of a nanoscale width; a second electrode of a nanoscale width; an active region disposed between the first and second electrodes, the active region containing a switching material; an area within the active region that constrains current flow between the first electrode and the second electrode to a central portion of the active region; and an interlayer dielectric layer formed of a dielectric material and disposed between the first and second electrodes outside the active region. A nanoscale crossbar array and method of forming the nanoscale switching device are also disclosed.

11 Claims, 7 Drawing Sheets

(56) References Cited

U.S. PATENT DOCUMENTS

| | | | |
|---|---|---|---|
| 2008/0090337 A1* | 4/2008 | Williams | 438/133 |
| 2008/0283815 A1 | 11/2008 | Nejad | |
| 2009/0014710 A1 | 1/2009 | Kawashima et al. | |
| 2009/0102598 A1* | 4/2009 | Yamazaki et al. | 338/20 |
| 2009/0140628 A1* | 6/2009 | Kuepper et al. | 313/317 |
| 2010/0090187 A1* | 4/2010 | Ahn et al. | 257/2 |
| 2010/0155686 A1 | 6/2010 | Bratkovski et al. | |
| 2010/0172170 A1 | 7/2010 | Tamai et al. | |
| 2010/0304566 A1* | 12/2010 | Fischer et al. | 438/674 |

FOREIGN PATENT DOCUMENTS

| | | |
|---|---|---|
| WO | WO-2007102483 A1 | 9/2007 |
| WO | WO-2008102718 A1 | 8/2008 |
| WO | WO-2009128142 A1 | 10/2009 |
| WO | WO-2010074689 | 7/2010 |
| WO | WO-2010087836 | 8/2010 |

OTHER PUBLICATIONS

International Search Report, Jun. 14, 2011, PCT Application No. PCT/US2010/049091, Filed Sep. 16, 2010.

Münstermann, Ruth, et al. "Morphological and electrical changes in TiO2 memristive devices induced by electroforming and switching." physica status solidi (RRL)—Rapid Research Letters 4.1-2 (2009): 16-18.

Ogimoto, Yasushi, et al. "Resistance switching memory device with a nanoscale confined current path." Applied physics letters 90.14 (2007): 143515-143515.

\* cited by examiner

9,040,948 B2

NANOSCALE SWITCHING DEVICE

STATEMENT OF GOVERNMENT INTEREST

This invention was made with government support under Contract No. HR0011-09-3-0001, awarded by Defense Advanced Research Project Agency. The government has certain rights in the invention.

CROSS-REFERENCE TO RELATED APPLICATION

The present application is related to application Serial Number PCT/US2010/029423, filed Mar. 31, 2010, which uses a metal oxide bit encapsulating coating to minimize parasitic resistance and eliminate sidewall shorts.

BACKGROUND

Significant research and development efforts are currently directed towards designing and manufacturing nanoscale electronic devices, such as nanoscale memories. Nanoscale electronics promises significant advances, including significantly reduced features sizes and the potential for self-assembly and for other relatively inexpensive, non-photolithography-based fabrication methods. However, the design and manufacture of nanoscale electronic devices present many new challenges.

For instance, nanoscale devices using switching materials such as titanium oxide that show resistive switching behavior have recently been reported. The switching behavior of such devices has been linked to the memristor circuit element theory originally predicted in 1971 by L. O. Chua. The discovery of the memristive behavior in the nanoscale switches has generated significant interest, and there are substantial on-going research efforts to further develop such nanoscale switches and to implement them in various applications. One of the many important potential applications is to use such switching devices as memory units to store digital data, in which an active region is sandwiched between two electrodes. A memory device may be constructed as an array of such switching devices in a crossbar configuration to provide a very high device density. There are, however, technical challenges that have to be addressed in order to make the switching devices useful for actual applications. One significant issue is how to maintain the switching characteristics of the switching devices over multiple ON/OFF cycles to provide a reasonably long operation life.

BRIEF DESCRIPTION OF THE DRAWINGS

Some embodiments of the invention are described, by way of example, with respect to the following figures.

DETAILED DESCRIPTION

In the construction of nanoscale crossbar memory, an active region is disposed between first and second electrodes, each of nanoscale width. The active region contains a switching material. In some examples, an interlayer dielectric layer, formed of a dielectric material, is disposed between the first and second electrodes outside the active region.

Figure 1:
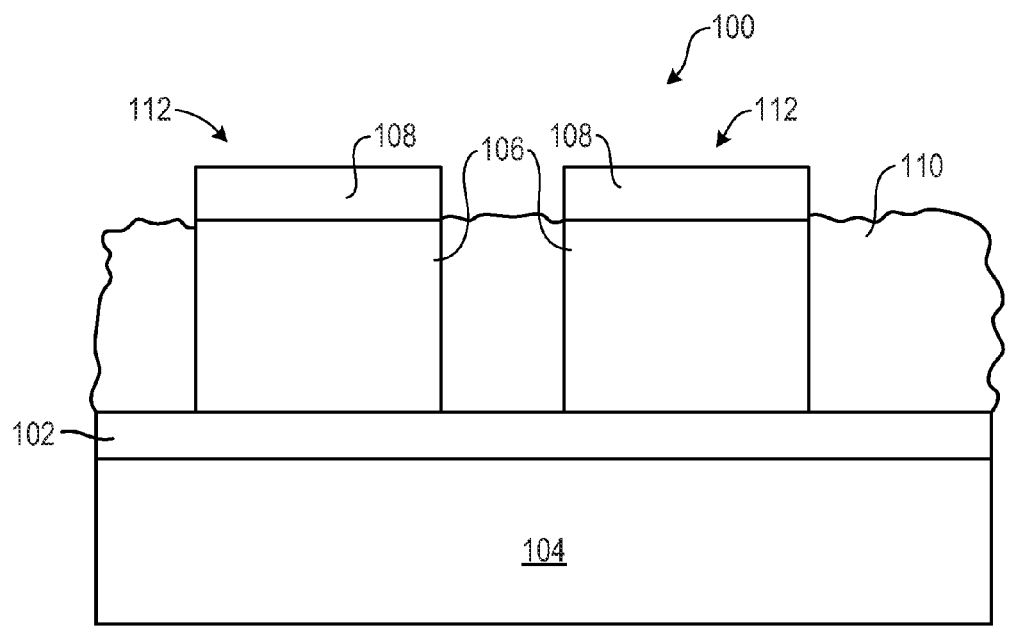
FIG. 1 is a side view of a bit construction in accordance with an example of the invention.

FIG. 1 depicts a present bit construction 100, in which a bottom electrode 102 is disposed on a substrate 104. An active region 106 (discussed more fully below) is disposed on the bottom electrode 102. A top electrode 108 is disposed on the active region 106 and is oriented approximately orthogonal to the bottom electrode 102. Either the bottom electrode 102 or the top electrode 108 may be the first electrode, and the other the second electrode. A dielectric material 110 fills in the spaces between adjacent active regions 108; the dielectric material is discussed in greater detail below. A single unit comprising an active region 106 sandwiched between the two electrodes 102, 108 is referred to as a bit 112.

Figure 2:
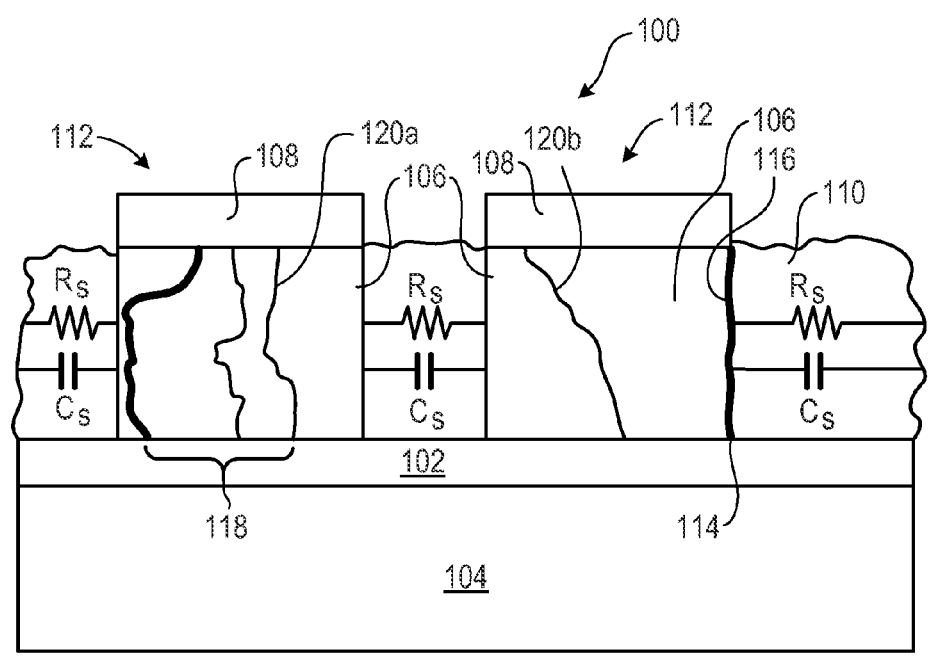
FIG. 2 is a view similar to that of FIG. 1, depicting possible issues with that bit construction.

There is an equivalent parasitic capacitance $C_S$ and parasitic resistance $R_S$, in parallel, between neighboring active regions 106 (not shown in FIG. 1, but depicted in FIG. 2). Potential issues that may arise with this construction include sidewall conduction, leakage paths between adjacent bits 112, unreliable bit conduction paths (along the device boundaries), and variability in device properties.

FIG. 2 depicts these potential issues. Sidewall conduction is depicted as a short 114 along a sidewall 116. Leakage paths between adjacent bits 112 are depicted by the presence of the parasitic capacitance $C_S$ and resistance $R_S$. Unreliable bit conduction paths are represented by shown by the brace 118, in which conduction may take one of many paths, that each may be of different length, thereby affecting the switching time. Variability in device properties is shown by conduction paths 120a, 120b, since each time, small variations can take place in the conduction path.

Figure 3:
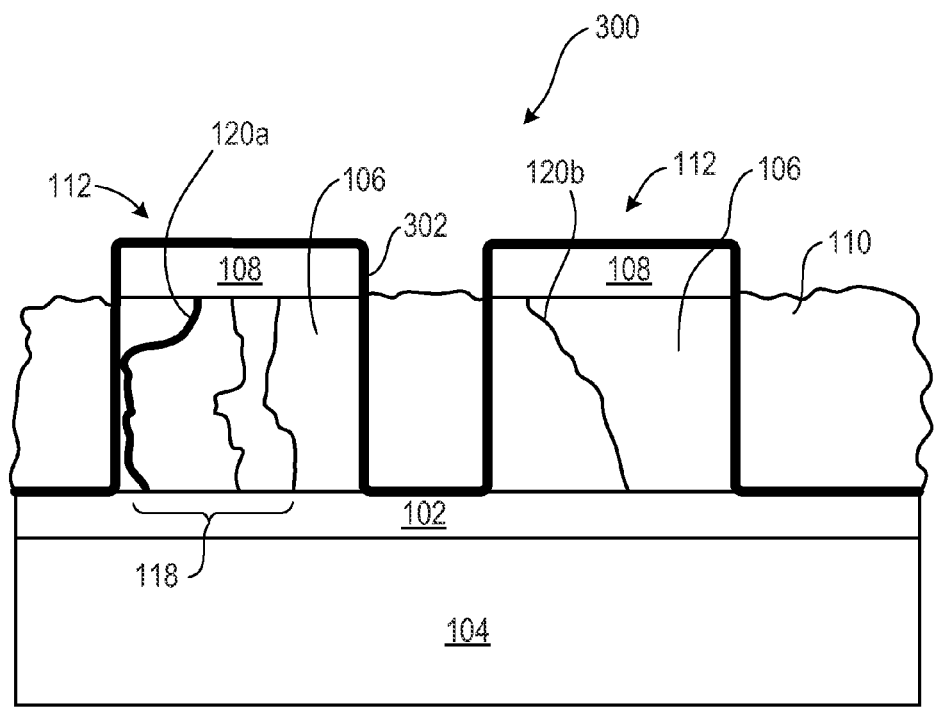
FIG. 3 is a view similar to that of FIG. 1, depicting encapsulated bits in accordance with teachings of the invention.

FIG. 3 depicts an example of structure 300 that is an improvement over the structure of FIGS. 1 and 2, namely, encapsulating the bits 112 with a dielectric cladding layer 302. The addition of the encapsulation minimizes the effect of parasitic resistance by isolating the bits 112 from each other. Further, shorts 114 running down the sidewalls 116 (shown in FIG. 2) are eliminated.

In the embodiment shown in FIG. 3, the cladding layer 302 surrounds the active region 106 and extends in height from at least the bottom electrode 102 to the top electrode 108. In this way, the protective cladding layer isolates or shields the active region 106 from the interlayer dielectric layer 110, and prevents the switching material from contacting and/or chemically interacting with the dielectric material of the interlayer dielectric layer. The protective cladding layer may be formed of a non-conducting cladding material that is chemically stable and unreactive to the switching material, and substantially impervious to the dopants in the switching material. As used herein, the term "impervious" means that the dopants cannot migrate through the cladding material under normal operating conditions. In this regard, the interlayer dielectric typically is selected to have a low dielectric constant so that the capacitance of the device will be low to allow a faster access time. Such dielectric materials, however, may have the tendency to chemically interact with the switching material. The cladding material, in contrast, is selected to be substantially chemically inert. Thus, the dopants in the switching material are confined in the active region 106 and cannot be lost or gained through the protective cladding layer 302.

By way of example, when the switching material comprising the active region 106 is $TiO_2$ (the switching material is described in greater detail below), the dopants are oxygen vacancies. The material comprising the cladding layer 302 in this case may be hafnium oxide ($HfO_2$), which is a thermodynamically more stable oxide and thus is effective in preventing oxygen vacancies or oxygen from moving away from the $TiO_2$ switching material. Other examples of usable cladding materials include zirconium oxide ($ZrO_2$), magnesium oxide (MgO), calcium oxide (CaO), aluminum oxide ($Al_2O_3$), etc. In contrast, the dielectric material forming the interlayer dielectric layer is different from the cladding material and may be, for example, an oxide, nitride, or carbide, such as silicon oxide ($SiO_2$), silicon nitride ($Si_3N_4$), silicon carbon nitride ($SiC_xN_y$), silicon oxynitride ($SiO_xN_y$), etc. The interlayer dielectric layer usually has a low dielectric constant. For example, the dielectric constant may be 4 or less.

Figure 4:
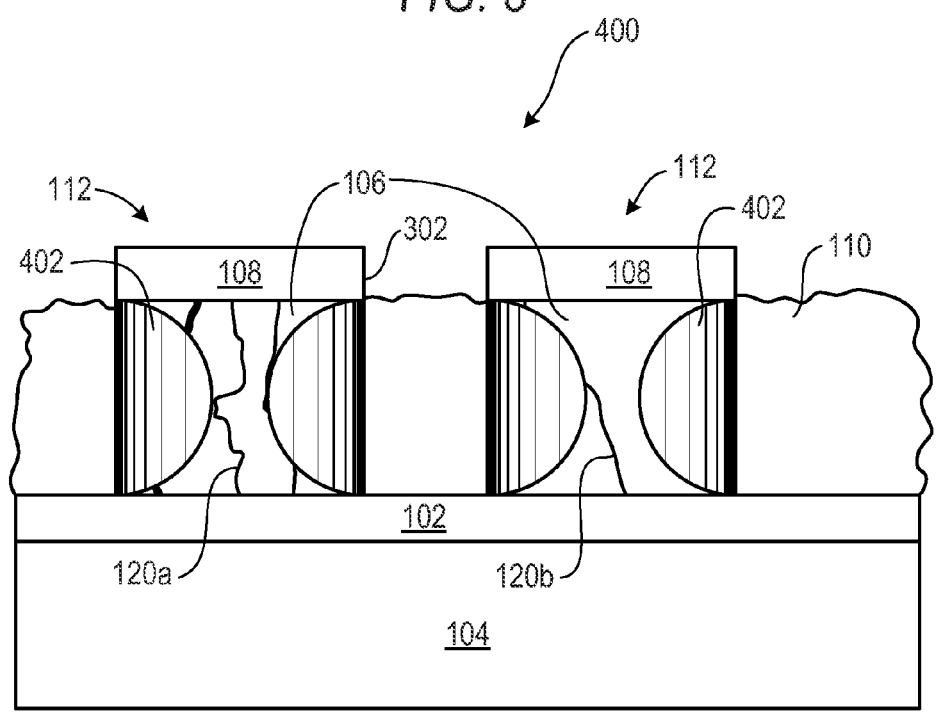
FIG. 4 is a view similar to that of FIG. 1, depicting an alternate example, employing a radially-varying oxygen profile in the active region in accordance with an example of the invention.

FIG. 4 shows a nanoscale switching device 400 in accordance with an example of the invention. The device 400 is constructed much like the device 100 shown in FIG. 1, but with a difference, namely, an area 402 within the active region that constrains current flow between the first electrode and the second electrode to a central portion of the active region. More specifically, the area may comprise an insulating material, such as a lateral oxidation in which the oxygen content varies radially, being higher at the periphery of the bit 112 (i.e., higher at the periphery of the active region 106) and lower near the center of the bit (i.e., lower at the center of the active region). While, as noted above, the active region is capable of carrying a species of dopants and transporting the dopant under an electric field, the lateral oxide is incapable of carrying a species of dopants and transporting the dopant under an electric field.

The current flow constraining area may be obtained in a variety of ways, such as plasma oxidation using oxygen gas.

As a consequence of employing the current flow constraining area, the following problems are solved: minimization of the effect of parasitic resistance, by isolating bits; elimination of shorts running down the sidewalls; obtaining current confinement at the center of the bit; modulation of the dielectric constant along the radial direction (less lossy as one moves outwards); and a decrease in current, and consequently operating power, and an increase in endurance.

Figure 5:
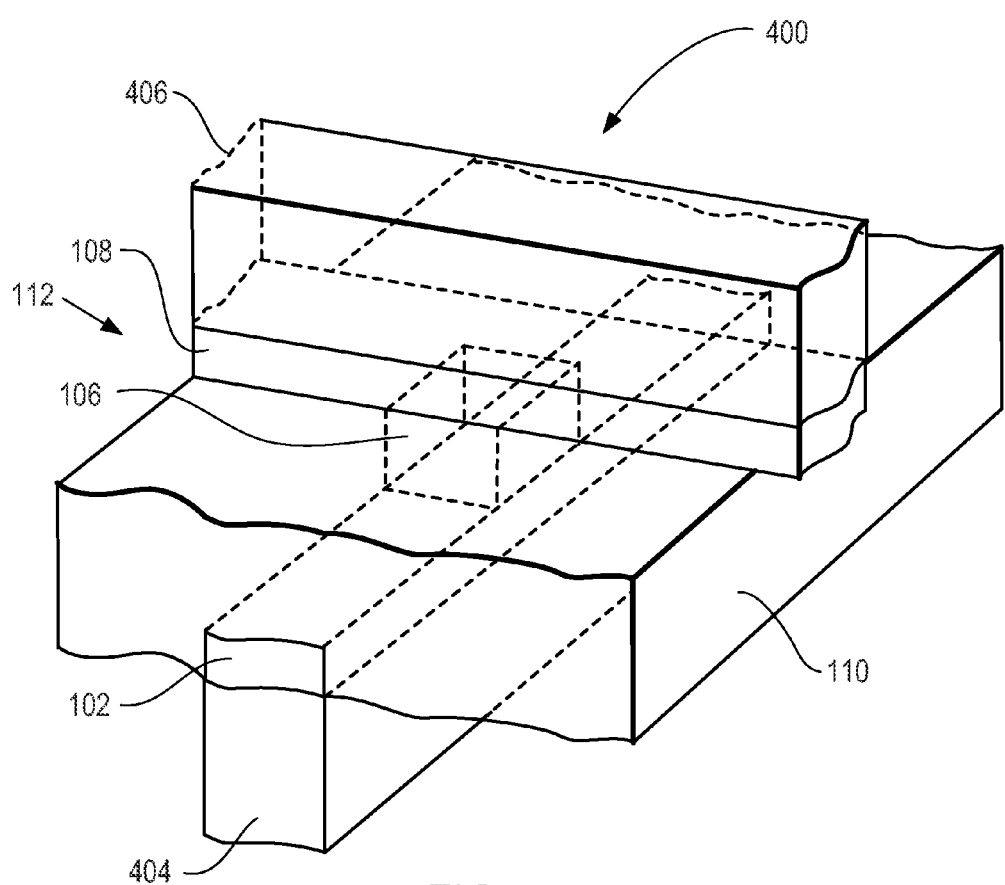
FIG. 5 is a schematic perspective view of the nanoscale switching device of FIG. 4 having a radially-varying oxygen profile in the active region in accordance with an example of the invention.

FIG. 5 depicts a perspective view of a single bit 112 of the device 400. The switching device 400 comprises a bottom contact structure that includes a word line 404 and the bottom electrode 102, and a top contact structure that includes the top electrode 108 and a bit line 406. Disposed between the top electrode 108 and bottom electrode 102 is the active region 106 that contains a switching material. As described in greater detail below, the switching material has electrical characteristics that can be controllably modified to allow the device to be switched to an ON state with a low-resistance value and an OFF state with a high-resistance value, or intermediate states between the ON and OFF states. The oxygen profile 402 is not visible in this view.

Each of the top electrode 108 and bottom electrode 102 may have a width that is on the nanoscale. As used hereinafter, the term "nanoscale" means the object has one or more dimensions smaller than one micrometer, and in some examples less than 500 nanometers and often less than 100 nanometers. For example, the electrodes 108 and 102 may have a width in the range of 5 nm to 500 nm. Likewise, the active region 106 may have a height that is on the nanoscale and typically from a few nanometers to tens of nanometers.

The word line 404, bit line 406, and electrodes 102 and 108 are electrically conductive but may be formed of different materials. In this example, the word line 404 and bit line 406 are for providing high conductivity or low resistance, and may be formed, for example, by a Cu damascene process or Al conductor process. The electrodes 102 and 108 may be formed of a conductive material selected to prevent the material of the word line 404 or bit line 406 from interacting with the switching material, and may be a metal such as platinum, gold, copper, tantalum, tungsten, etc., metallic compounds such as titanium nitride, tungsten nitride etc., or doped semiconductor materials. In some other examples, the electrodes 102 and 104 may provide sufficient conductance and the word line 404 and bit line 406 may not be necessary.

In the example shown in FIG. 5, the top electrode 108 extends at an angle to the bottom electrode 102. The angle may be, for example, around 90 degrees, but may be of other values depending on the device design. As the top and bottom electrodes 108 and 102 are on different height levels, and the active region 106 occupies generally only the area of overlap between the electrodes, structural support is needed for the top electrode 108. To that end, the space under the top electrode 108 and outside the active region 106 may be largely filled with a dielectric material to form the interlayer dielectric layer 110. The interlayer dielectric layer 110 provides structural support and also electrically insulates the electrodes 108 and 102. It also isolates the switching device from any adjacent switching devices.

Figure 6:
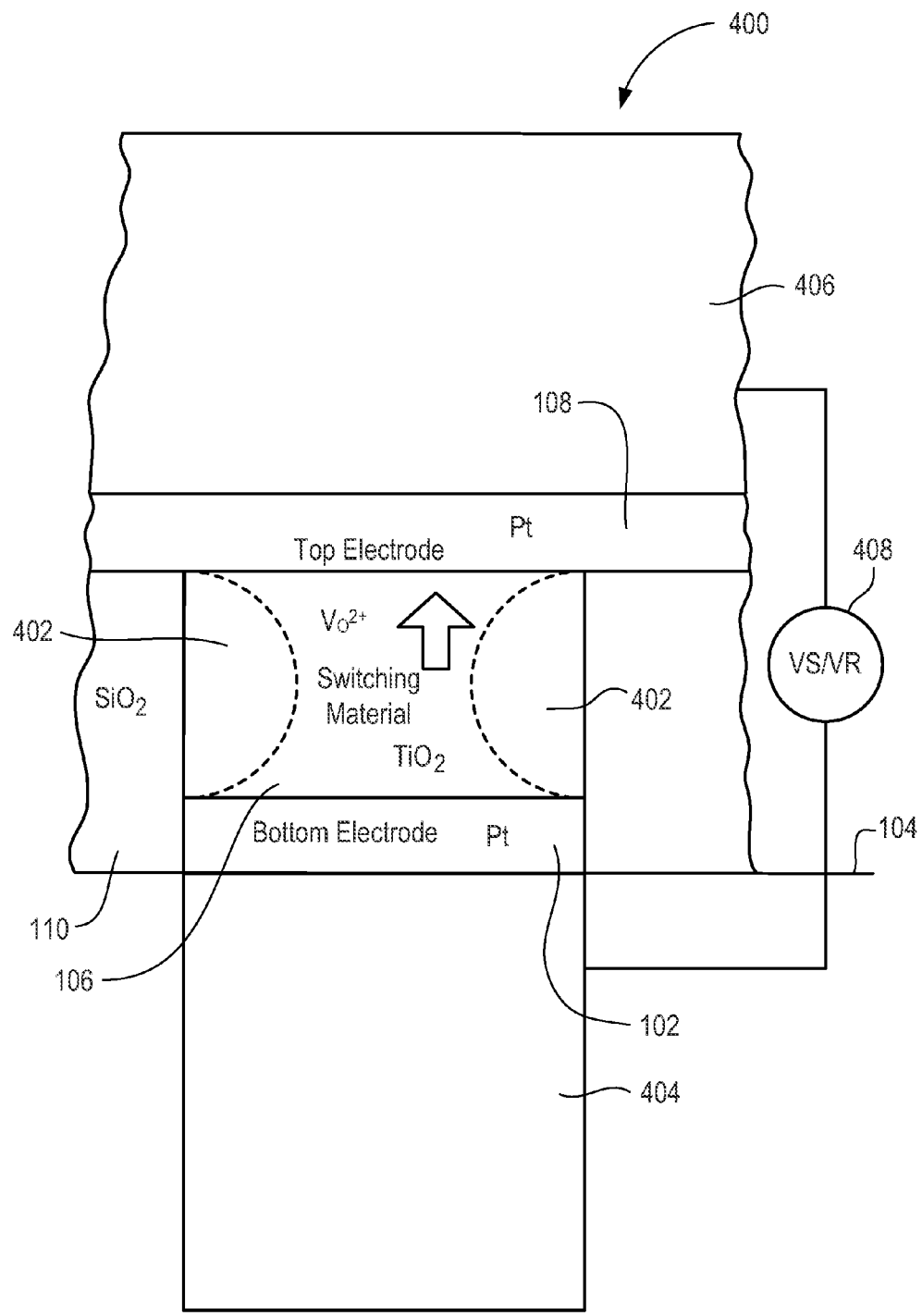
FIG. 6 is a schematic cross-sectional view of the nanoscale switching device of FIG. 5, in greater detail.

To facilitate a better understanding of the issues addressed by the invention, the components and operation principles of the switching device 400 in one example are described with reference to FIG. 6. As shown in FIG. 6, the active region 106 disposed between the top electrode 108 and bottom electrode 102 contains a switching material. The switching material is capable of carrying a species of mobile ionic dopants such that the dopants can be controllably transported through the switching material and redistributed to change the electrical properties of either the switching material or the interface of the switching material and an electrode, which in the illustrated example of FIG. 6 may be the top electrode 108. This ability to change the electrical properties as a function of dopant distribution allows the switching device 400 to be placed in different switching states by applying a switching voltage from a voltage source 408 to the electrodes 108 and 102.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors.

The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. The II-VI compound switching materials may also include phase change materials. The switching materials may also include filament structures such as a-Si:Ag that has Ag filaments in an a-Si matrix. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of a transition metal oxide such as $TiO_2$, the dopant species may be oxygen vacancies ($V_O^{2+}$). For GaN, the dopant species may be nitride vacancies or sulfide ion dopants. For compound semiconductors, the dopants may be n-type or p-type impurities or metal filamentary inclusions.

By way of example, as illustrated in FIG. 6, the switching material may be $TiO_2$, and the dopants may be oxygen vacancies ($V_O^{2+}$). When a DC switching voltage from the voltage source 408 is applied to the top and bottom electrodes 108 and 102, an electric field is created across the active region 106. This electric field, if of sufficient strength and proper polarity, may drive the oxygen vacancies to drift through the switching material in the active region 106 towards the top electrode 108, thereby turning the device in an ON state.

If the polarity of the electric field is reversed, the oxygen vacancies may drift in an opposite direction across the active region 106 and away from the top electrode 108, thereby turning the device in an OFF state. In this way, the switching is reversible and may be repeated. Due to the relatively large electric field needed to cause dopant drifting, after the switching voltage is removed, the locations of the dopants remain stable in the switching material. In other words, the switching may be non-volatile.

The state of the switching device 400 may be read by applying a read voltage from the voltage source 408 to the top and bottom electrodes 108 and 110 to sense the resistance across these two electrodes. The read voltage is typically much lower than the switching voltage required to cause drifting of the ionic dopants in the active region 106, so that the read operation does not alter the ON/OFF state of the switching device.

The switching behavior described above may be based on different mechanisms. In one mechanism, the switching behavior may be an "interface" phenomenon. For instance, in the illustrated example of FIG. 6, initially, with a low concentration of oxygen vacancies in the $TiO_2$ switching material near the top electrode 108, the interface of the switching material and the top electrode 108 may behave like a Schottky barrier, with an electronic barrier that is difficult for electrons to go through. Similarly, the interface of the switching material and the bottom electrode 106 may also behave like a Schottky barrier, with a flow direction opposite to that of the Schottky-like barrier at the top electrode 106. As a result, the device has a relatively high resistance in either flow direction. When a switching voltage is applied to the top and bottom electrodes 108 and 102 to turn the device ON, with the top electrode as the negative side, the oxygen vacancies drift towards the top electrodes 108. The increased concentration of dopants near the top electrode 108 changes the electrical property of the interface from one like a Schottky barrier to one like an Ohmic contact, with a significantly reduced electronic barrier height or width. As a result, electrons can tunnel through the interface much more easily, and the switching device 400 is now in the ON state with a significantly reduced overall resistance for a current flowing from the bottom electrode 102 to the top electrode 108.

In another mechanism, the reduction of the resistance of the active region 106 may be a "bulk" property of the switching material. The redistribution of the dopant level in the switching material causes the resistance across the switching material to fall, and this may account for the decrease of the resistance of the device between the top and bottom electrodes 108 and 102. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

As can be seen from the above description, the redistribution of dopants in the switching material in the active region may be responsible for the switching behavior of the switching device. If the amount of dopants in the active region is altered in an unintended way, the switching characteristics of the device may be changed uncontrollably. One possible mechanism for undesired dopant amount alteration is the diffusion of the dopants from the switching material into the surrounding materials or the reaction of the switching material or the dopants with the surrounding materials. It has been observed by the inventors that when a transition metal oxide, such as $TiO_2$, is used as the switching material, a substantial change in the amount of oxygen vacancies can occur over time if the switching material is in direct contact with the interlayer dielectric layer, which is typically formed of silicon oxide, silicon nitride, or silicon carbon nitride. Due to the small volume of the switching material in the active region of the switching device and the relatively low concentration of the dopants, even a small amount of dopant loss (or gain) can have significant impacts on the switching characteristics of the device. The device may even lose its ability to switch if the dopant amount is changed too much, or the edge of the device may be made conducting by the change in the dopant amount at the edge.

This problem of dopant change is effectively solved by the inclusion of the radially-varying oxygen profile 402 in the nanoscale switching device 400.

Figure 7:
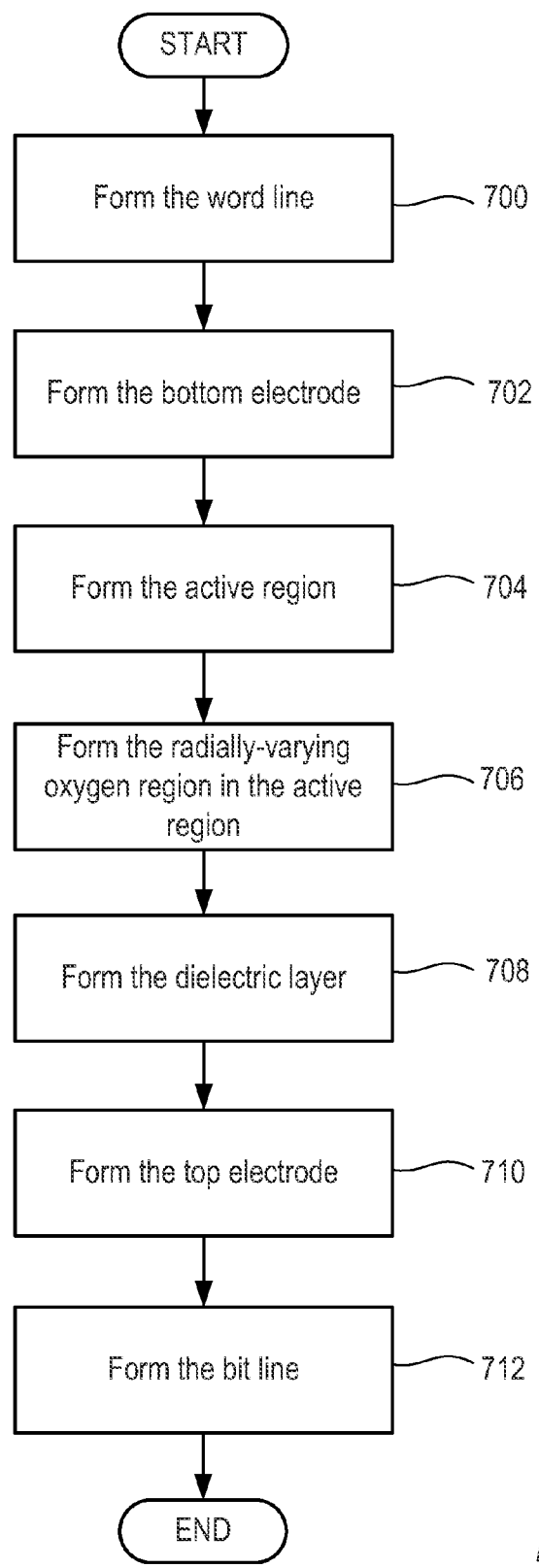
FIG. 7 is a flow chart showing an example method for making the nanoscale switching device with a protective cladding layer in accordance with the teachings of the invention.
Figure 8A:
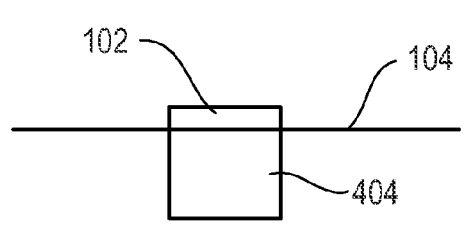
FIGS. 8A-8E are schematic cross-sectional views showing the formation of layers on a substrate corresponding to steps of the method of FIG. 7.
Figure 8B:
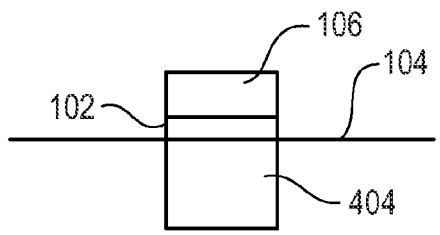

FIG. 7 shows a method of an example of the invention for forming the nanoscale switching device with a protective cladding layer. This method is described in conjunction with FIGS. 8A-8E, which illustrate the evolution of the device stack structure resulting from the steps of the method in FIG. 7. First, the word line 404 is formed in the substrate 104 (step 700), and the bottom electrode 102 is formed over the word line 404 (step 702), as shown in FIG. 8A. The bottom electrode 102 may be an elongated structure, but only its width is seen in the cross-sectional view of FIG. 8A. A layer of a switching material is then deposited on the bottom electrode 102 and formed into the active region 106 (step 704), as shown in FIG. 8B. The active region may have a generally rectangular or square shape, or circular or oval shape. This step of forming the active region may include first depositing a layer of switching material over the entire substrate and covering the bottom electrode, and then patterning the active region using a photoresist and etching away the switching material outside the patterned active region.

Figure 8C:
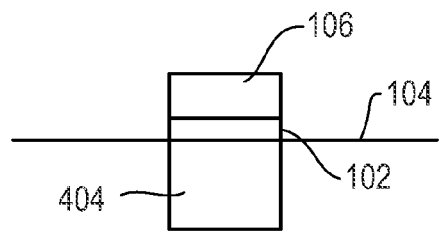

The sidewalls of the active region 106 are oxidized to generate the radially-varying profile 402. The oxidation may be performed, for example, using plasma oxidation at the end of the plasma etch process that defines the bits 112. The resultant structure is shown in FIG. 8C. The oxidation may also be performed by annealing in oxidizing environment or combining oxygen plasma with heating.

Figure 8D:
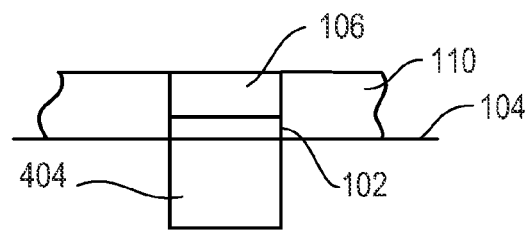
Figure 8E:
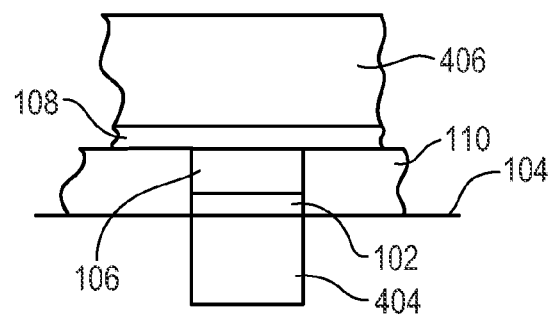

A layer 110 of dielectric material is then deposited over the structure of FIG. 8C, and an electro-chemical planarizing (CMP) process is used to flatten the dielectric layer 110 and to expose the top of the active region 106 (step 708), as shown in FIG. 8D. A top electrode 108 is then formed over the active region 106 and the interlayer dielectric layer 110 (step 710), and a bit line 406 in the form of a relatively thick conductive layer is formed over the top electrode 108 (step 712), as shown in FIG. 8E. This step may include depositing a layer of electrode material over the active region and the dielectric layer, patterning the top electrode, and etching away excess electrode material to form the top electrode 108. The method of FIG. 7 described above is only an example of how to form a switching device with the cladding layer, and other methods may be used to form such a structure.

Figure 9:
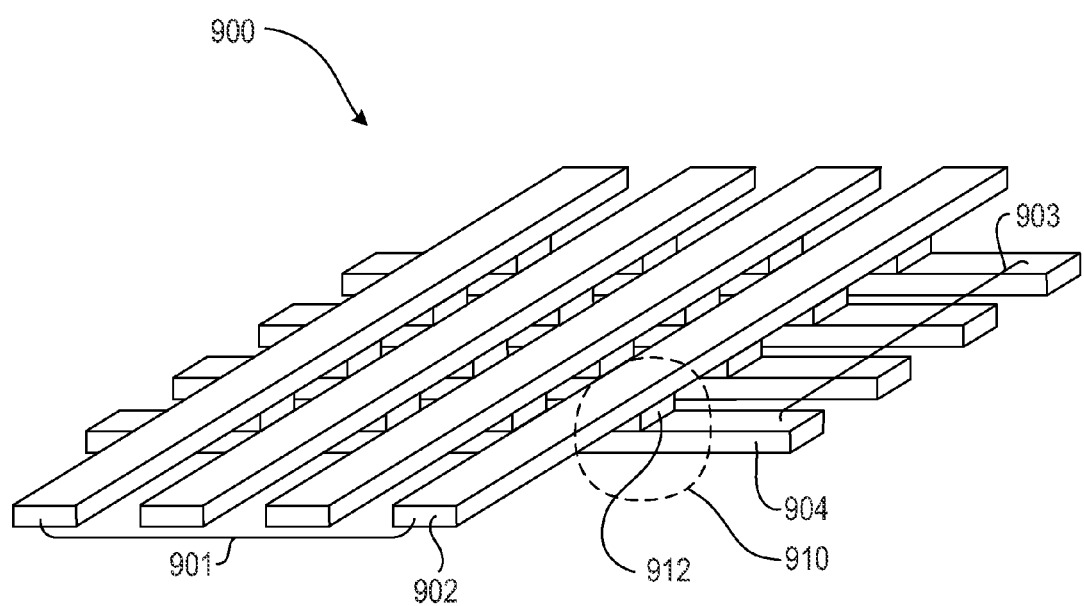
FIG. 9 is a schematic perspective view of a crossbar array of nanoscale switching devices each having a protective cladding layer, in accordance with an example of the invention.

Multiple nanoscale switching devices, each with a protective cladding layer, may be formed into a crossbar array for various applications. FIG. 9 shows an example of a two-dimensional array 900 of such switching devices. The array has a first group 901 of generally parallel nanowires 902 in a top layer, and a second group 903 of generally parallel nanowires 904 in a bottom layer. The nanowires 902 in the first group 901 run in a first direction, and the nanowires 904 in the second group 903 run in a second direction at an angle, such as 90 degrees, from the first direction. The two layers of nanowires form a two-dimensional crossbar structure, with each nanowire 902 in the top layer intersecting a plurality of the nanowires 904 of the bottom layer. A nanoscale switching device 910 may be formed at each intersection of the nanowires in this crossbar structure. The switching device 910 has a nanowire 902 of the first group 901 as its top electrode, and a nanowire 904 of the second group 903 as its bottom electrode. An active region 912 containing a switching material is disposed between the top and bottom nanowires 902 and 904. Although not visible in FIG. 9, the active region 912 includes the radially-varying oxygen profile.

The space between the top and bottom layers outside the active region 912 of the nanoscale switching device 910 may be filled with a dielectric material to form an interlayer dielectric layer, which for clarity of illustration is not explicitly shown in FIG. 9.

The electrodes 102, 108 and 902, 904 may be square or rectangular in cross-section, as shown in the various figures. However, other cross-sectional shapes, such as circular, ovoid, and others, may also be employed.

In the foregoing description, numerous details are set forth to provide an understanding of the present invention. However, it will be understood by those skilled in the art that the present invention may be practiced without these details. While the invention has been disclosed with respect to a limited number of examples, those skilled in the art will appreciate numerous modifications and variations therefrom. It is intended that the appended claims cover such modifications and variations as fall within the true spirit and scope of the invention.

What is claimed is:

1. A nanoscale switching device comprising:
    a first electrode of a nanoscale width;
    a second electrode of a nanoscale width;
    an active region disposed between the first and second electrodes, the active region containing a switching material;
    an area within the active region that constrains current flow between the first electrode and the second electrode to a central portion of the active region; and
    an interlayer dielectric layer formed of a dielectric material and disposed between the first and second electrodes outside the active region;
    wherein the area that constrains current flow within the active region comprises a lateral oxidation region of the switching material.

2. The nanoscale switching device of claim 1, wherein the switching material is capable of carrying a species of dopants and transporting the dopants under an electric field.

3. The nanoscale switching device of claim 1, wherein the lateral oxidation region has a content of oxygen that varies radially, being higher at the periphery of the active region and lower near the center of the active region.

4. The nanoscale switching device of claim 1, wherein the dielectric material is an oxide, a carbide, a nitride, or combination thereof.

5. A nanoscale crossbar array comprising:
    a first group of conductive nanowires running in a first direction;
    a second group of conductive nanowires running in a second direction and intersecting the first group of nanowires;
    a plurality of switching devices formed at intersections of the first group of nanowires with the second group of nanowires, each switching device having a first electrode formed by a first nanowire of the first group and a second electrode formed by a second nanowire of the second group, an active region disposed at the intersection between the first and second electrodes, an area within the active region that constrains current flow between the first electrode and the second electrode to a central portion of the active region, and an interlayer dielectric layer of a dielectric material disposed between the first and second groups of nanowires outside the active region, the active region containing a switching material;
    wherein the area that constrains current flow within the active region comprises a lateral oxidation region of the switching material.

6. The nanoscale crossbar array of claim 5, wherein the switching material is capable of carrying a species of dopants and transporting the dopants under an electric field.

7. The nanoscale crossbar array of claim 5, wherein the lateral oxidation region has a content of oxygen that varies radially, being higher at the periphery of the active region and lower near the center of the active region.

8. The nanoscale crossbar array of claim 5, wherein the dielectric material is an oxide, a carbide, a nitride, or combination thereof having a dielectric constant of 4 or less.

9. A method of forming a nanoscale switching device, comprising:
    forming a first electrode of a nanoscale width and a second electrode of a nanoscale width;
    forming an active region between the first and second electrodes, the active region comprising a switching material capable of carrying a species of dopants and transporting the dopants under an electric field;
    forming an area within the active region that constrains current flow between the first electrode and the second electrode to a central portion of the active region; and
    forming an interlayer dielectric layer of a dielectric material outside the active region;

wherein the switching material is a first metal oxide, and the area that constrains current flow is a lateral oxidation region of the switching material.

10. The method of claim 9, wherein the lateral oxidation region has a content of oxygen that varies radially, being higher at the periphery of the active region and lower near the center of the active region.

11. The method of claim 9, wherein the step of forming the area that constrains current flow includes a plasma etch to define bits in an array of the nanoscale switching devices and an oxidation of the active region with or without elevated temperature.

* * * * *